US007337160B2

(12) United States Patent
Marshall et al.

(10) Patent No.: US 7,337,160 B2
(45) Date of Patent: Feb. 26, 2008

(54) USE OF RADIATION-HARDENED CHALCOGENIDE TECHNOLOGY FOR SPACEBORNE RECONFIGURABLE DIGITAL PROCESSING SYSTEMS (75) Inventors: Joseph R. Marshall, Manassas, VA (US); Richard W. Berger, Woodbridge, VA (US); John C. Rodgers, Fairfax, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 336 days.

(21) Appl. No.: 10/918,814

(22) Filed: Aug. 12, 2004

(65) Prior Publication Data

US 2005/0027409 A1 Feb. 3, 2005

Related U.S. Application Data (63) Continuation of application No. 10/334,317, filed on Dec. 31, 2002, now Pat. No. 6,996,443.

(60) Provisional application No. 60/537,866, filed on Jan. 1, 2004.

(51) Int. Cl.
*G06N 5/00* (2006.01)

(52) U.S. Cl. .......................................... 706/62; 706/45

(58) Field of Classification Search ................. 706/62, 706/45; 365/163, 226; 348/148; 257/678
See application file for complete search history.

(56) References Cited

U.S. PATENT DOCUMENTS

| 5,914,893 | A | | 6/1999 | Kozicki et al. | |
|---|---|---|---|---|---|
| 6,072,716 | A | * | 6/2000 | Jacobson et al. | ........... 365/163 |
| 6,418,049 | B1 | | 7/2002 | Kozicki et al. | |
| 6,586,921 | B1 | | 7/2003 | Sunter | |
| 6,653,193 | B2 | | 11/2003 | Gilton | |
| 6,653,195 | B1 | | 11/2003 | Gonzalez et al. | |
| 6,660,136 | B2 | | 12/2003 | Li et al. | |
| 6,670,016 | B1 | | 12/2003 | Kim et al. | |
| 6,683,739 | B2 | | 1/2004 | Nagata et al. | |
| 6,687,114 | B1 | | 2/2004 | Kamath et al. | |
| 6,690,026 | B2 | | 2/2004 | Peterson | |
| 6,692,994 | B2 | | 2/2004 | Davis et al. | |
| 6,707,087 | B2 | | 3/2004 | Fricke et al. | |
| 6,707,776 | B2 | | 3/2004 | Nagata et al. | |
| 6,709,887 | B2 | | 3/2004 | Moore et al. | |
| 6,709,958 | B2 | | 3/2004 | Li et al. | |
| 6,710,423 | B2 | | 3/2004 | Moore et al. | |
| 6,730,384 | B2 | | 5/2004 | Yamamoto et al. | |
| 6,730,547 | B2 | | 5/2004 | Li et al. | |
| 6,737,312 | B2 | | 5/2004 | Moore | |
| 6,737,726 | B2 | | 5/2004 | Gilton | |
| 6,897,892 | B2 | * | 5/2005 | Kormos | ....................... 348/148 |
| 6,940,777 | B2 | * | 9/2005 | Ooishi | ....................... 365/226 |
| 7,019,391 | B2 | * | 3/2006 | Tran | ........................... 257/678 |

OTHER PUBLICATIONS

Hunt, Reliability and Qualification of 4Mb Chalcogenide-based Random Access Memory, Microelectronics Reliability & Qualification Workshop, Air Force Research Laboratory (AFRL), Jul. 2003, pp. 1-18.*
U.S. Appl. No. 10/334,317, filed Dec. 31, 2002, Applicants Joseph Marshall, Alan F. Dennis, Charles A. Dennis and Steven G. Santee, assigned to BAE Systems Information and Electronic Systems Integration Inc.
PCT International Search Report dated Jan. 19, 2007 of International Application No. PCT/US05/01727 filed Jan. 20, 2005.

* cited by examiner

*Primary Examiner*—Wilbert L Starks, Jr.
(74) *Attorney, Agent, or Firm*—Daniel J. Long; Robert K. Tendler (57) ABSTRACT Chalcogenide technology is used for radiation hardening for spaceborne systems and more particularly in C-RAM form for processors, field programmable gate arrays, startup RAMs, shadow storage and single-chip systems to protect these units.

17 Claims, 7 Drawing Sheets

USE OF RADIATION-HARDENED CHALCOGENIDE TECHNOLOGY FOR SPACEBORNE RECONFIGURABLE DIGITAL PROCESSING SYSTEMS

RELATED APPLICATIONS

This application is a continuation in part of U.S. patent application Ser. No. 10/334,317, filed Dec. 31, 2002 now U.S. Pat.No. 6,996,443 and claims the benefit under 35 Usc 119(e) of U.S. Patent Application No. 60/537,866 filed Jan. 1, 2004.

FIELD OF INVENTION

This invention relates to space vehicle electronics and more in particularly to the utilization of chalcogenide technology for radiation hardening of spaceborne systems.

BACKGROUND OF THE INVENTION

In the past decade, signal and data processing aboard spacecraft has advanced rapidly from KIPS or thousands of instructions per second to MIPS or millions of instructions per second and are approaching GIPS or billions of instructions per second. The result is the utilization of increasingly powerful commercial technology that has to be adapted for space applications. The use of this technology in on-board processing permits repairable and reconfigurable systems in space. Such systems are described in U.S. patent application Ser. No. 10/334,317, filed Dec. 31, 2002 by Joseph Marshall, Alan F. Dennis, Charles A. Dennis and Steven G. Santee, assigned to the assignee hereof and incorporated herein by reference.

As is common in the design of electronics carried in space vehicles, a massive amount of redundancy has heretofore been utilized such that if one of the particular processing systems goes down due to massive incoming radiation or component failures, it was the policy to provide for redundant processing to repair the electronics by simply duplicating it and calling up the duplicate processor. Another approach is to utilize reconfigurable spaceborne processors and to reprogram and/or reconfigure these processors from the ground in the case of malfunction or a change in mission.

There are five areas of vulnerability in spaceborne applications due to either naturally occurring radiation or radiation which is the result of a nuclear release. Foremost in vulnerability are reconfigurable processors that are reprogrammed remotely from a ground station where the processors themselves are subject to damage due to radiation. Secondly, an area of vulnerability is the startup read-only memory or ROM for the processors, which if damaged will cause system failure when their contents are read.

Thirdly, the reconfigurable systems which use field programmable gate arrays or FPGAs are vulnerable. Fourth, vulnerability exists for systems that are utilized to store a shadow state which provides backup in case of errors or nuclear events so that the system can be recovered.

Finally, vulnerability exists for single-chip reconfigurable systems in which all of the reconfigurable and other components are on a single board in which all components are packaged into a single element.

More particularly, as to the need for reconfiguration in space systems, until recently, satellites have incorporated only limited on-board processing. The majority of data was passed through the satellite and transmitted to a terrestrial processing facility, limited primarily by the bandwidth of the down link. This lack of autonomy and on-board signal processing was driven primarily by technology limitations, as the power required to perform complex signal processing on flight was beyond the capacity of the satellite to provide it.

Note that the newest space systems have significantly more processing capability and seldom have enough external bandwidth or size, weight and power margin to perform all their missions reliably using all unique processing elements for each processing or recovery need. This increase in processing requirements also requires reducing redundancy used to combat component failures. This reduced redundancy requires better radiation hardening.

The migration to 0.15 micron radiation hardened technology at space foundries combined with hardened by design techniques and the continuing positive Total Ionizing Dose results on many commercial semiconductor lines ensure that there are many technologies to consider when constructing a space processing subsystem. However, utilizing 0.15 micron radiation hardening technology is not sufficient.

As to the need for better reconfigurable technology for space, to mitigate upsets, RAM-based FPGAs employ internal triple modular redundancy (TMR) and configuration read-back and compare of the configuration storage. Each of these elements is necessary for the reconfigurable systems.

In the past, reconfigurable technology for space includes fuse-based FPGA, SRAM-based FPGA, FLASH-based FPGA, and FLASH-based memory.

As to existing reconfiguration technologies, all of them are subject to failure in the presence of high radiation levels which can occur in space or which are the result of a nuclear event. Two popular configuration and reconfiguration technologies include competing FPGA approaches that are currently being used for spaceborne applications, i.e., fuse-based and SRAM-based technology. Fuse technology has historically been used because of the superior power/performance associated with fused configuration. The hard-wired fuse approach also eliminates the ability to upset the configuration data through single event effects (SEE) upset, although faults can be introduced into the logic functions of the FPGAs as well as into on-chip SRAM arrays. While both technologies support the use of triple-modular redundancy to combat SEE such as latch up, gate rupture or upset, better radiation resistance is required to eliminate the complexity, real estate, weight and power requirements of the triple modular redundancy. However, only the SRAM-based FPGA can be reconfigured.

Also, triple modular redundancy does not solve the underlying problem of avoiding damage due to radiation. Redundancy only applies to switching to undamaged circuits in the event of malfunction. Typically, for FPGAs, a soft reset is required to remove a single event function interrupt (SEFI), which necessitates a reload of the FPGA configuration data from an external source.

While the SRAM-based FPGA is field-programmable, its storage is volatile. As a result, external non-volatile memories are typically added externally to load the FGPA programming data upon power-up.

As to non-volatile FLASH memory and FPGA technologies, the most widely available non-volatile memory technology is FLASH, which comes in two variations, NAND-based and NOR based. Both FLASH technologies employ a dual gate structure with a control gate for programming the FLASH and a floating gate that acts as the non-volatile storage element. Charge pumps are employed to generate high voltages needed to write and erase the FLASH elements. In general, the NAND-based approach allows higher density, while the NOR-based approach supports more flexible programming methods and faster programming and read speeds.

However, radiation characterization of both varieties of FLASH memory chips has demonstrated SEE susceptibility in the control logic functions, where some of the write failures were attributed to upsets in the state machines and decoders. Other failures may have been caused by bus contention created from errors created within the control logic. Total Dose tolerance was also very limited.

Non-volatile FLASH-based FPGA products have been announced for commercial use, although they do not have sufficient radiation tolerance for spaceborne applications. The FLASH structure in the FPGA employs separate transistors that share the floating transistor. One is used to program the FLASH circuit and the other is used to configure the FPGA logic.

An anti-fuse radiation-tolerant product under development has been announced that incorporates triple-modular-redundancy storage elements directly into the logic blocks and an on-chip scrubbing circuit for the SRAM blocks, simplifying user efforts. However, as mentioned before, triple modular redundancy does not in and of itself offer radiation resistance but rather relies on costly redundancy if one part of a circuit is damaged.

Much of the recent work on FLASH, while not addressing radiation resistance, has been in the area of multilevel cell storage, which increases the amount of data that can be stored in a single FLASH cell to between two and four bits. This requires the ability to resolve analog voltages in a $2^n$ ratio to the number of bits. While this increases density, there are tradeoffs in performance and the maximum number of program/erase cycles. Programming of NOR-based devices with Channel Hot Electrons (CHE) and either constant or ramped voltage programming has been successful for two bits/cell, although it requires program and verify overhead circuitry to extend to 3-4 bits/cell. Programming using Fowler-Nordheim Tunneling allows faster programming speeds at the expense of higher programming voltages than the Channel Hot Election approach, but suffers from limited data-retention time.

An advance in magnetic tunnel junction MRAM development was recently announced that eliminates adjacent bit disturbance and allows scaling to smaller geometries. The approach employs a write mode with two overlapping pulses that toggle the direction of the magnetic field. The technology requires that a write include a prior read sequence to determine which bits require toggling. A 4 Mb MRAM in 180 nm lithography is being produced using this technique. This technology is expected to have good radiation resistance though it will be harder to integrate with other technologies.

Although FeRAM continues to progress in the commercial arena with memories as large as 64 Mb in 130 nm lithography, radiation testing of several existing FeRAM devices demonstrated SEE sensitivity at a linear energy transfer, LET=20, rendering them unacceptable for most significant radiation environments.

None of the above storage and processing techniques address the fundamental problem of damage due to radiation and how radiation can damage a component by causing it to malfunction or to read in false data or instructions. When considering spaceborne applications, radiation hardening is thus of paramount concern.

By way of further background, chalcogenide technology has been used in the rewritable DVD and CD-ROM industries as illustrated by U.S. Pat. Nos. 6,730,384; 6,707,776; 6,683,739; and 6,670,016. Chalcogenide technology has also been used for non-radiation-hardened logic elements, switches and the like as illustrated in U.S. Pat. Nos. 6,707,087; 6,670,016; 6,660,136; 6,653,195; 6,709,887; 6,709,958; 6,710,423; 6,690,026; 6,737,312; 6,730,547; 6,586,921; 6,687,114; 6,653,193; and 6,737,726. In none of these patents is any radiation hardening property indicated. Moreover, U.S. Pat. No. 6,692,994 entitled "Method for manufacturing a programmable chalcogenide fuse within a semiconductor device," assigned to the assignee hereof, describes fused semiconductor devices, but does not indicate the utility for radiation hardening.

SUMMARY OF THE INVENTION

In the subject invention, spaceborne multi processor network architecture is protected utilizing chalcogenide technology in the form of Chalcogenide Random Access Memories or C-RAMs to provide radiation hardening. It has been found that the phase change operation of chalcogenide devices is uniquely unaffected by large doses of radiation.

Architecture taking advantage of a chalcogenide technology is composed of a group of hardware and software building blocks that are combined utilizing well defined interfaces to perform general purpose processing, and more particularly signal processing. In the subject invention, chalcogenide technology used in the CD and DVD industry for writing onto these devices is adapted to protect spaceborne processors and memory. It is also used for startup read-only memories (ROMs), for FPGAs, for shadow state storage to recover from error or a nuclear event and to protect single-chip systems.

The radiation hardening comes from the fact that the C-RAM technology is a non-volatile technology that uses the large range of electrical resistance that is obtained when switching a chalcogenide glass between two physical states, amorphous and polycrystalline. Chalcogenides are so named because they are alloys containing one or more Group VI elements. The alloy used contains Germanium, Antimony and Tellurium, and is the same alloy used in re-writable CD and DVD technologies.

The reversible change in physical state is accomplished through thermal activation that is impervious to radiation bursts. The state change is rapid, repeatable and reversible up to 1E12 times. The two states differ in reflectivity and electrical resistance. In optical storage technologies laser heating drives the phase change and the difference in reflectivity is sensed optically. In the C-RAM technology, the change in state is effected through Joule heating and the electrical resistance change, which can be several orders of magnitude, is sensed with a trickle current through the programmed device.

In one embodiment, to program a high resistance '0' state the material is heated briefly above the approximately 600° C. melt temperature, (Tm), and then quenched to "freeze in" the amorphous state. A '1' is programmed by raising the material to a lower, crystallization temperature, (Tx), for a somewhat longer time. In the present state of the art, programming times are on the order of a few 10's of nanoseconds to program a '0' and less than 500 ns to program a '1'. This is a vast improvement over many other non-volatile memory technologies, which typically require 10 ms to complete a write cycle.

An additional advantage of C-RAM over the floating gate technologies associated with FLASH memory is that there is no requirement for a programming voltage above VDD, presently 3.30V in C-RAM. FLASH memory requires 7 volts or more to program the cell. This voltage can be externally supplied or can be developed internally with a "charge pump." In either case, some transistors in the design must be able to withstand the higher voltage and this increases design complexity and reliability risk. Furthermore, total ionizing dose radiation has been shown to cause early failure of on-chip charge pumps.

As part of the subject invention, it has been found that the chalcogenide material is not affected by total ionizing dose radiation. Because the memory state of the device is not dependent on a charge storage mechanism, the C-RAM technology is as radiation tolerant as the base CMOS technology into which it is integrated. This, combined with the operating speed and write endurance advantages that C-RAM holds over other non-volatile memory technologies, make it an extremely attractive solution for space based applications While the two states used in C-RAM are well separated by a large resistance range, intermediate values can also be programmed. This leads to potential applications such as multi-state memories and re-programmable analog devices.

Present re-programmable FPGAs rely on one of two strategies. The configuration information for the device can be stored in an array of memory cells or it can be stored in configuration bits distributed throughout the device. Volatile re-programmable FPGAs must rely on external storage of configuration information, which must be re-loaded after power-on. Non-volatile FPGAs for space use typically store the configuration in EEPROM or battery-backed SRAM.

A chalcogenide-based non-volatile FPGA can be made in either of the base architectures and would have distinct advantages over FLASH-memory based implementations. The write cycle time and write cycle endurance of chalcogenide are each at least four orders of magnitude better than FLASH memory. It is a finding of the subject invention that chalcogenide memory is radiation insensitive and, unlike FLASH memory cells, there is no requirement for high voltage programming and the attendant reliability impairment. In addition, no 1 MRad (Si) total dose tolerant, SEU hardened implementation of a FLASH memory based non-volatile, re-programmable FPGA has been demonstrated to date.

A single C-RAM-based configuration bit circuit can be used as the basis for circuits to perform all the functions of a data latch, including D, Flip-Flop and Master/Slave configurations. The C-RAM latch can then be used as a non-volatile latch in almost any functional application.

In terms of the use of chalcogenide technology for reconfigurable space platforms or subsystems, one type of reconfigurable digital processing system for space includes the utilization of field programmable gate arrays (FPGAs) provided with chalcogenide fuses, wires or configuration bits. The fuses, wires or configuration bits are used to reconfigure software processors in a spacecraft through the reprogramming of one or more FPGAs such that one obtains a power/performance characteristic for signal processing tasks that can not be achieved simply through the use of off-the-shelf processors.

For damaged or otherwise inoperable signal processors located on a spacecraft, the remaining processors which are undamaged can be reconfigured through changing the machine language and binary to the field programmable gate arrays to change the core processing functions while at the same time maintaining undamaged components so that the signal processing functions can be restored utilizing a C-RAM based FPGA. Multiple FPGAs can be connected together by a data bus and are also provided with data pipes that interconnect selected FPGAs together to provide the necessary processing function or functions. Flexibility in reconfiguration includes the utilizing of a specialized timing and synchronization block as well as a common configuration block which when coupled to an interconnect block permits reconfiguration of a customizable application core, depending on the particular signal processing function desired. The result is that damaged or inoperable signal processing components can be repaired in space by rewriting chalcogenide reversible fuses, wires or configuration bits without having to physically attend to the hardware. This is accomplished by transmitting to the spacecraft commands which reconfigure the particular FPGAs thus to alter their signal processing function. Whether or not damaged, the same system can be used mid-flight to reconfigure processors in the same way for new mission tasks.

In summary, chalcogenide technology is used for radiation hardening for spaceborne systems and more particularly in C-RAM form for processors, field programmable gate arrays, startup RAMs, shadow storage and single-chip systems to protect these units.

BRIEF DESCRIPTION OF THE DRAWINGS

These and other features of the subject invention will be better understood in connection with the Detailed Description in conjunction with the Drawings, of which.

DETAILED DESCRIPTION

Figure 1:
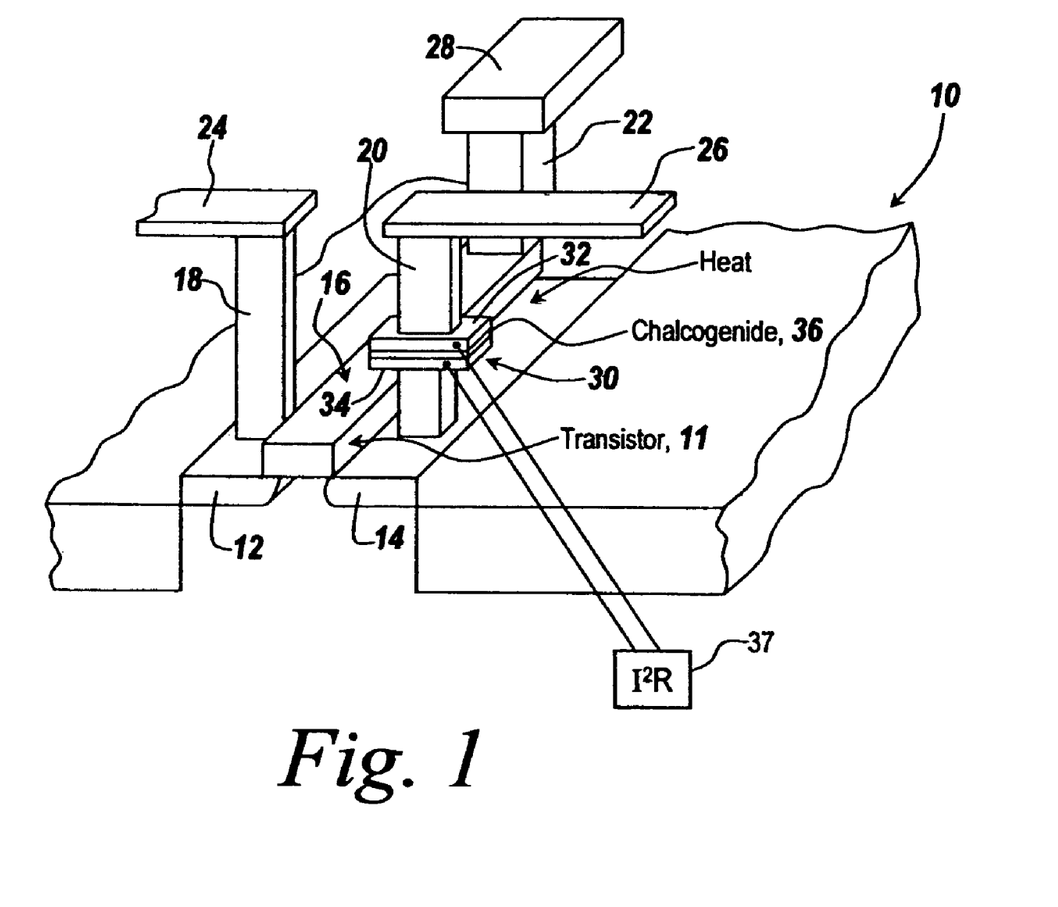
FIG. 1 is a diagrammatic illustration of a chalcogenide-fused transistor for use in the RAM section of an FPGA.

Referring now to FIG. 1, for radiation hardening, a simple transistor switch 10 is provided with either n- or p-doped regions 12 and 14 and a control gate 16, and is provided with leads 18, 20 and 22 in the form of studs that have respective lateral extending portions 24, 26 and 28.

Interposed in stud 20 is a fuse element 30, which includes a top electrode 32 and a bottom electrode 34 along with a chalcogenide-doped layer 36 sandwiched therebetween.

The chalcogenide material in one embodiment is a GeSbTe alloy that exists in a polycrystalline state at low temperatures and an amorphous state at high temperatures.

As can be seen at 37, an $I^2R$ current can be applied across electrodes 32 and 34 to heat the chalcogenide layer, thus to change the conductive properties of the chalcogenide layer from a low conducting state to a high conducting state.

Figure 2:
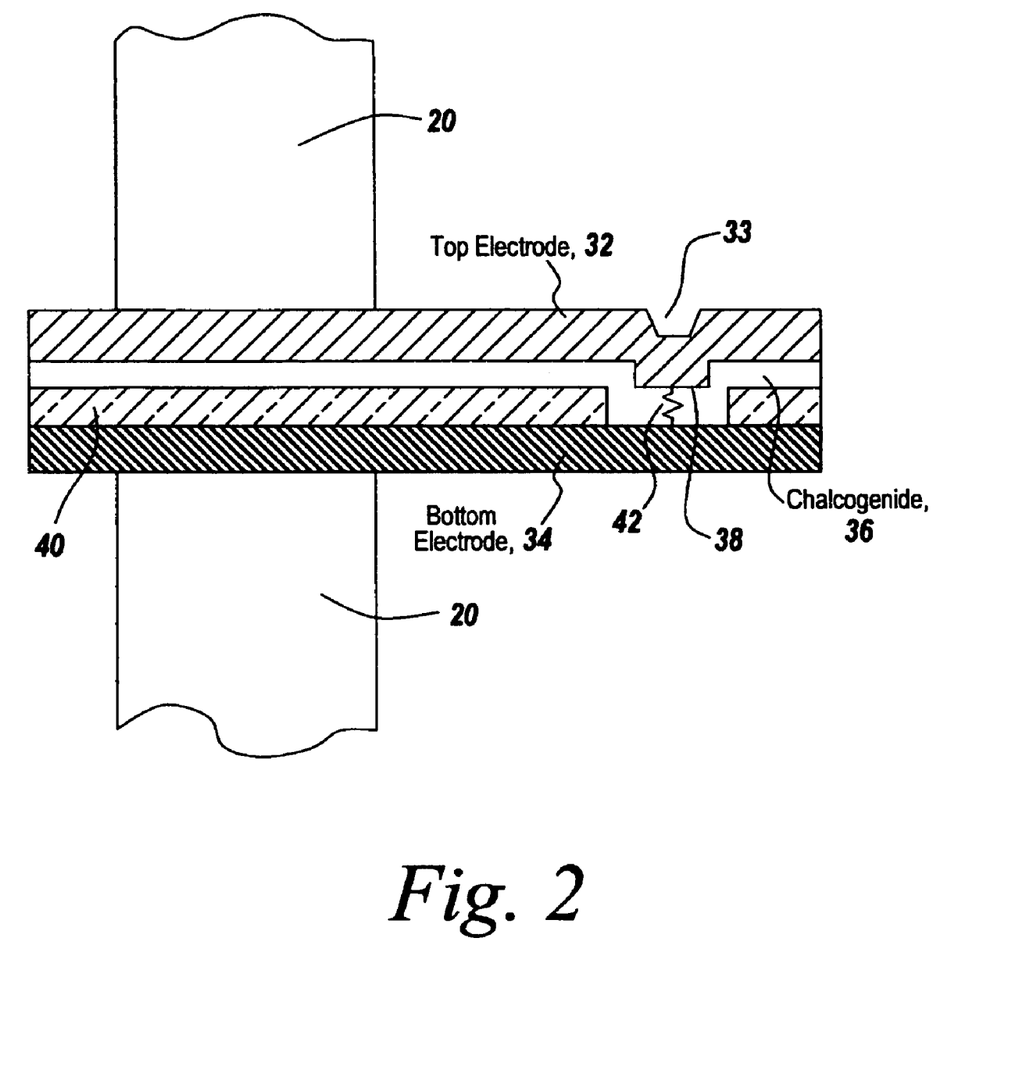
FIG. 2 is an exploded view of the chalcogenide fuse portion of the fused transistor of FIG. 1.
Figures 3, 4:
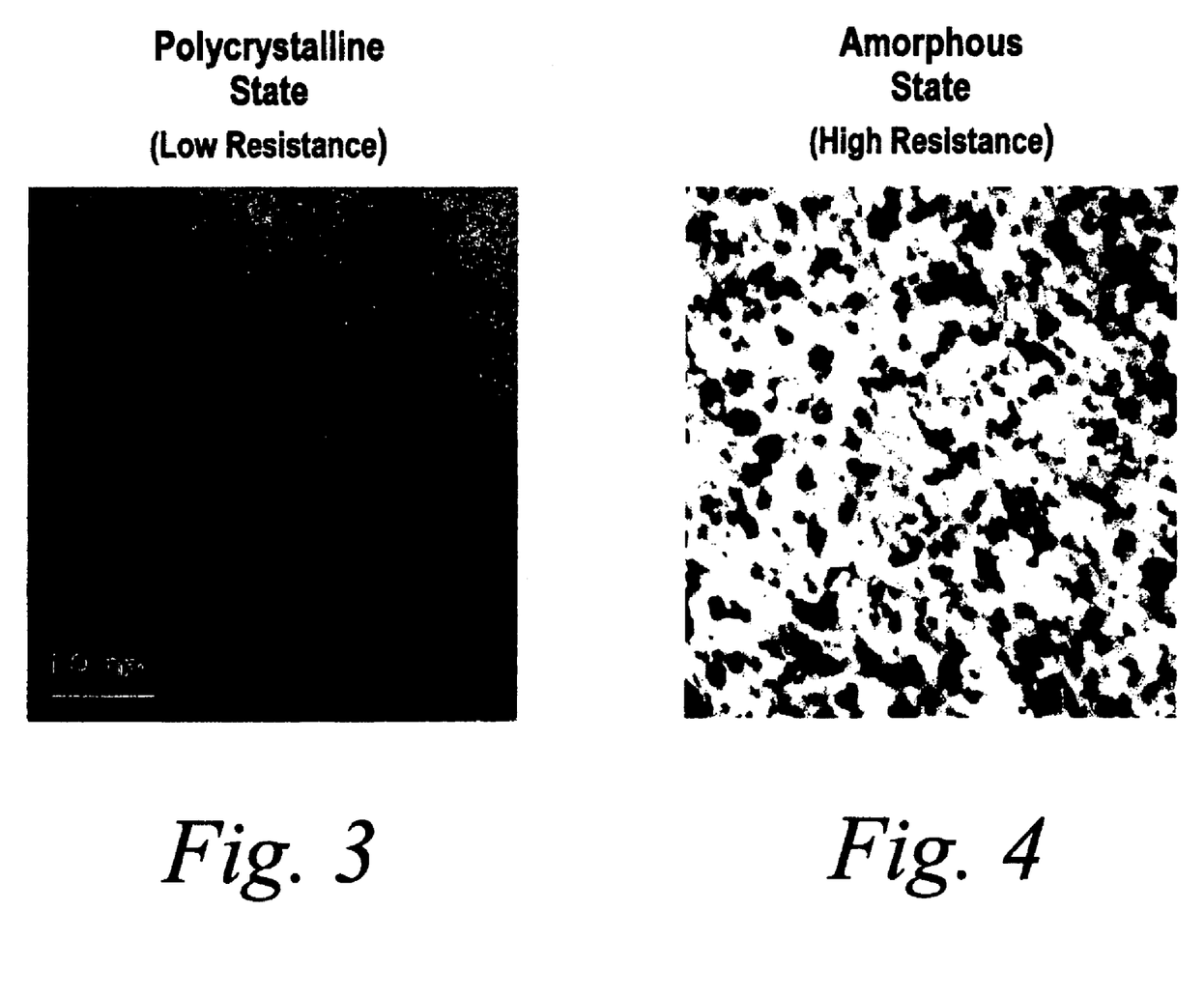
FIG. 3 is a transmission electron microscope image of a chalcogenide layer in its polycrystalline low resistance state.
FIG. 4 is a transmission electron microscope image of the chalcogenide layer of FIG. 3 in its high resistance amorphous state produced by heating the layer.

Referring to FIG. 2 in which like reference characters are used between FIGS. 1 and 2, top electrode 32 in one embodiment has a notch 33, with a corresponding downward projection 38 projecting into chalcogenide layer 36. Here a patterned dielectric layer 40 is utilized to complete the structure. It is the resistance diagrammatically shown at 42 that is controlled by the phase of the chalcogenide material such that, for instance, utilizing a GeSbTe alloy and referring to FIG. 3, a transmission electron microscope image of the polycrystalline cooled state shows a structure that produces a low resistance across the layer between electrodes 32 and 34. As shown in the image of FIG. 4 in the amorphous, high resistance state caused by $I^2R$ joule heating, there is a high resistance between electrodes 32 and 34.

C-RAM or C-RAM FPGA Logic in Interface ASICS

In an interface ASIC such as a SpaceWire ASIC, there are a number of configuration registers that must be loaded each time the ASIC is powered up typically by the controlling processor or a local micro-controller near or in the Interface ASIC. For radiation hardening and non-volatile storage, the C-RAM technology is substituted for these registers providing a memory for the interface and minimizing the amount of repetitive configuration each time.

C-RAM FPGA logic is also applied to much of the protocol areas of an interface ASIC. For the most comprehensive reconfiguration changes, only the true physical devices would need to be replaced. Just as commercial FPGAs have numerous choices for I/O books for each pin on an FPGA device, which are configured as part of the programming, a similar approach places generic LVDS, IEEE 1394 and SpaceWire I/Os with configurable logic behind each interface. This allows reconfiguration between different interfaces of a similar topology to take place throughout a system. This can be used to change the nature of the interface between periods of a mission possibly resulting in lower power or guaranteed delivery. It also takes advantage of the features of one interface over another in a failure recovery mode, thus eliminating the need for spare or redundant resources.

It may not be necessary to have such total reconfiguration. Other nodes or parts of a processing or payload system may be fixed in their ability to use a single type of interface due to the use of ASICs such as the SpaceWire ASIC or other off the shelf parts. In this case, an interface ASIC utilizes either C-RAM and/or C-FPGA logic for hardware assist on the higher levels of a protocol such as the transport layer.

OTHER C-RAM USES

C-RAM as a Reconfigurable Computer (RCC), Startup ROM (SUROM) or SRAM

EEPROM or battery backed SRAM are typically used to store programs and configurations in space processing systems. Many times these are stored in central locations and then must be distributed during power up, power cycling or recovery to the processing, instrument and communications elements. Often such information is then stored locally in SRAM devices. EEPROM devices qualified for space typically contain between 256K and 1 M bits and are often stacked to achieve enough storage for a mission in a reasonable amount of space. SRAMs for space today are typically 4 M bits per device and may be similarly stacked.

A 4 M bit C-RAM allows a one-for-one replacement of SRAM in the local applications and greatly improves the density of SUROM and EEPROM storage. C-RAM may be stacked like either memory allowing universal replacement. Also write times by program and hardware are improved. In many cases, one entire layer of storage can be eliminated, as the code and configuration information may be stored locally.

C-RAM as Standalone FPGAs

Due to its inherent radiation hardness, standalone C-RAM FPGAs no longer require external memory to store the configuration of the FPGA. Comparison and reloading is no longer needed. With proper tool and design constants, the C-RAM standalone FPGA can be used widely throughout systems wherever maximum ASIC performance or density is not required.

C-RAM Embedded with CPU for State Capture for 1750 Architectures

In the first generation of spaceborne computers, the Generic VHSIC Spaceborne Computer (GVSC), which employed the military 1750A architecture incorporated a "checkpoint/rollback" feature. This was implemented through a redundant "shadow" SRAM memory that stored the previous processor state and was updated with each new instruction executed. In the case of an error, the processor could recover through reloading of the state from the shadow memory.

With the large on-chip cache memories on the current generation of microprocessors, the size of completely duplicated hardened SRAM memories is prohibitive. However, the relatively small size of a C-RAM memory and its radiation hard and non-volatile properties offers the opportunity to store a previous state that can be recovered even in the case of a power interrupt. Because the cycle time of C-RAM exceeds that of a single cycle in current microprocessors, this shadow storage condition would be implemented through a flag at a point in the program where data is not being continuously updated.

C-RAM to Capture State Data in Nuclear Event Scenario

An additional area for which C-RAM technology is useful is the preservation of the machine state and recovery after an operational interruption, as can be signaled by a Nuclear Event Detector or other system-generated fault signal. C-RAM and based-based latch technologies with increased write cycle endurance make it possible to preserve the internal state of many devices such as ASICs and microprocessors on a periodic basis.

For example, a C-RAM cell with a write cycle time of 500 ns and an endurance of 1E12 write cycles could capture the internal state of a device once per millisecond over a ten year mission life with an overhead cost of less than 1%. While this timing could result in thousands of lost instructions in a 1 GHz system, it represents a 100 fold increase in capability when compared to FLASH based systems and makes a state recovery system feasible.

RECONFIGURABLE PROCESSING SYSTEMS

Reconfigurable Processing Architecture

Figure 5:
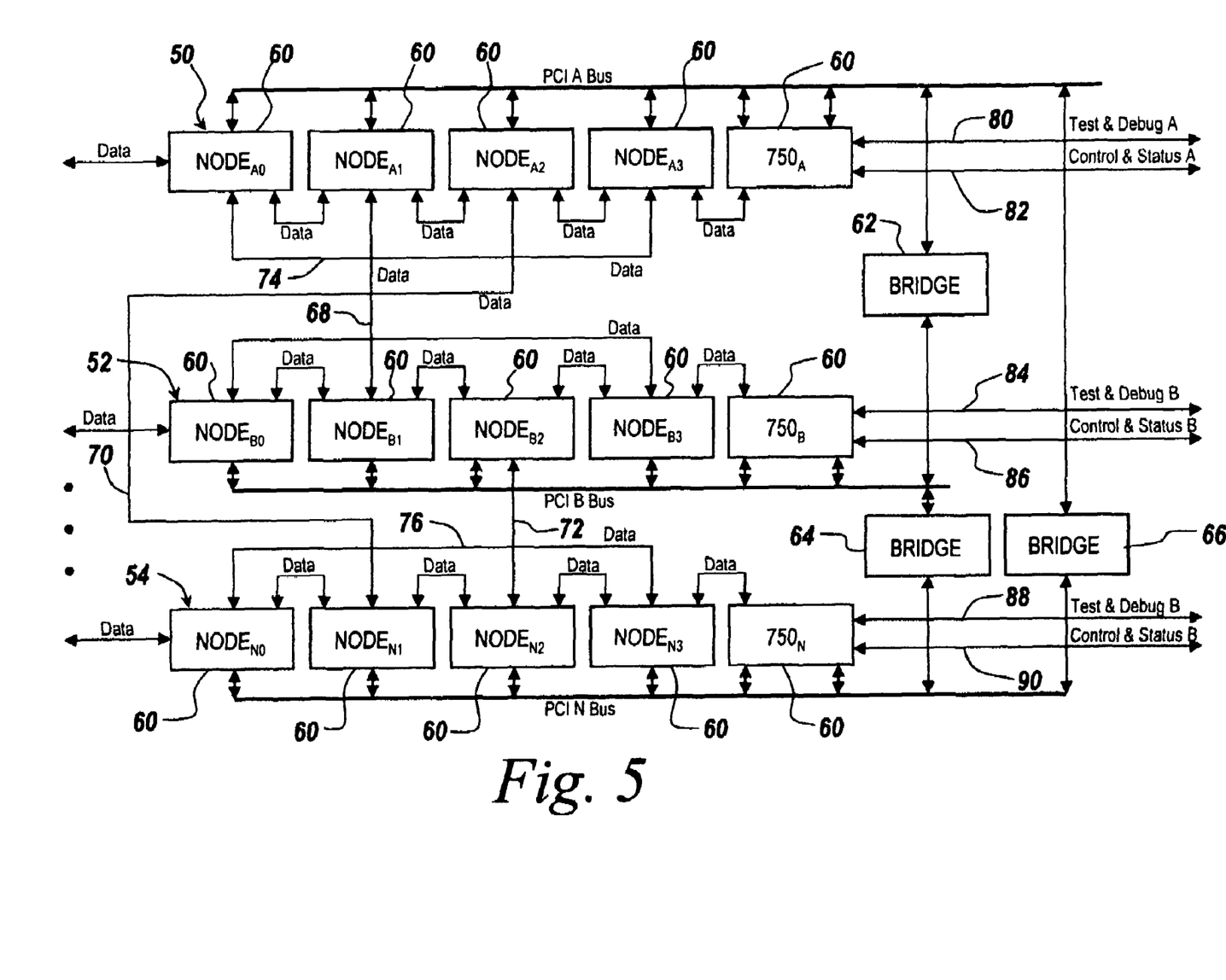
FIG. 5 is a block diagram of a reconfigurable processing architecture.

FIG. 5 shows one form of reconfigurable processing architecture described in U.S. patent application Ser. No. 10/334,317. Data is processed in clusters of processing nodes interconnected with Peripheral Component Interconnect (PCI) Interfaces for control and simple data pipes for high-speed data transfers. A general-purpose processor node controls each cluster. Nodes may contain memory, general purpose processing or signal processing or combinations of these. Up to three data ports are present in each node along with the PCI interface. Inter-cluster connections may be used for control and data handling (PCI to PCI Bridge) or data processing (Data pipes).

Referring to FIG. 5, a reconfigurable processing architecture includes a number of rows 50, 52 and 54 of nodes $A_0$-$750_n$. Each row has a number of nodes 60 which are interconnected by data buses and a PCI bus. Each of the rows has its dedicated PCI bus. The various PCI buses are bridged by units 62, 64 and 66 as illustrated. Various of the nodes are interconnected directly as can be seen by double-headed arrow 68 which is interconnected with a node $A_1$ to a note $B_2$. Note also that node $A_2$ is interconnected with node $N_1$ by a data bus 70, whereas node $B_2$ is interconnected with node $N_2$ by a data bus 72. Any of the nodes in FIG. 5 may have their configuration memory, configuration registers, start-up ROM or other stored programs, and signal processing logic functions replaced by C-RAM or C-FPGAs.

Additionally, nodes within a row may be interconnected such as shown by double-headed arrows 74 and 76. Note also that there are test-and-debug as well as control-and-status signals as illustrated by double-headed arrows 80, 82, 84, 86, 88 and 90 coupled to the respective elements of a row.

Each node in the architecture of FIG. 5 is typically a printed circuit card. There are three form factors that this architecture easily maps into. These form factors are CompactPCI® 3U, IEEE 1101.7 (SEM-E Stretch), and the CompactPCI 6U form factors. General purpose processor cards are available in all three technologies. Additionally, a reconfigurable computer card is available in the SEM-E Stretch form factor. This card is easily mapped into a 6U Compact PCI card as card real estate is similar between the two form factors.

Reconfigurable Processing Products

A combination of a general purpose computer with a reconfigurable processing element is still a viable solution when a smaller amount of reconfigurable logic is required. This can fit on either SEM-E Stretch or a 6U form factor.

A 3U CompactPCI Reconfigurable Computer is an attractive solution for a smaller system requiring some reconfigurable logic. It utilizes the key designs of the current reconfigurable processing node and provides a single Xilinx Virtex 1000 of reconfigurable logic, a PCI interface and 1 MB of Error Correcting Code (ECC) checked SRAM. A block diagram of this is shown in FIG. 6.

Figure 6:
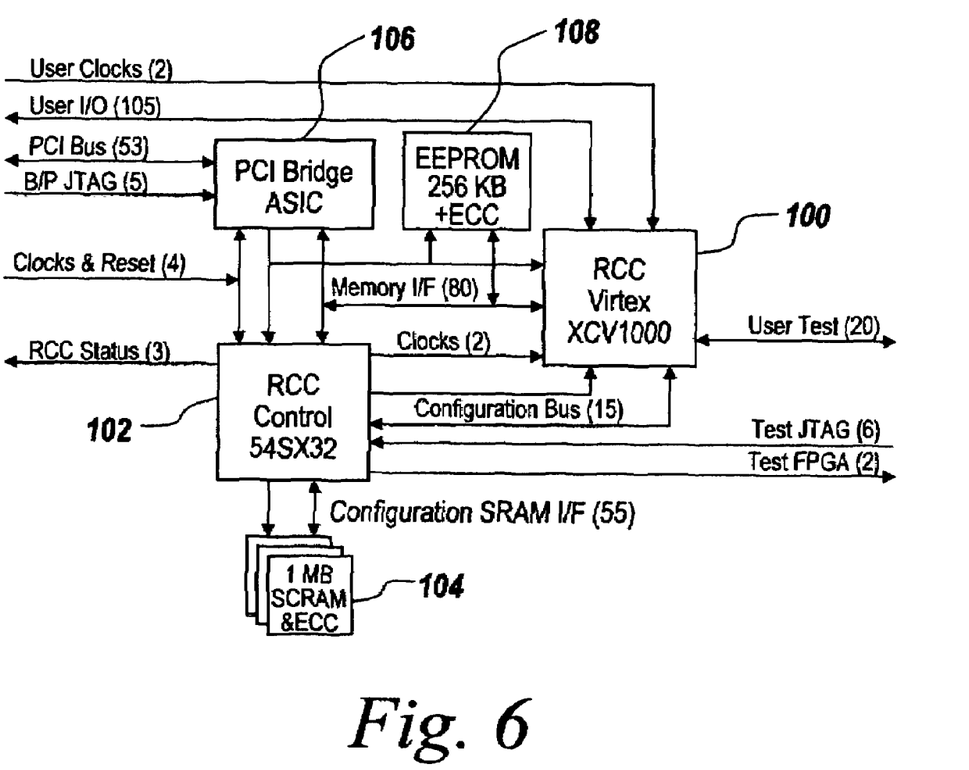
FIG. 6 is a block diagram of a 3U reconfigurable computer utilizing currently-available components.

Referring now to FIG. 6, a block diagram of a 3U reconfigurable computer is illustrated in which an RCC module 100 is connected to a reconfigurable computer, RCC control 102, which is in turn coupled to a 1-MB SRAM and ECC 104. A PCI bridge ASIC 106 is coupled to RCC control 102 and RCC module 100. As can be seen, an EEPROM 108 is coupled to RCC module 100, to RCC control 102 and to PCI bridge ASIC 106 to provide non-volatile programming. Note that user clocks, user I/O, a PCI bus, a B/P Joint Test Action Group (JTAG), clocks and reset, a user test, a test JTAG and a test FPGA line are coupled to the indicated portions of the computer.

It is noted that various components of this computer may be provided with radiation-hardened C-RAMs for appropriate programming.

Note that logic interconnects are done on the backplane. This allows up to 7 million gates of reconfigurable logic in a single 8 slot 3U chassis with a general purpose computer in the controller slot. With larger FPGAs, this is easily increased by up to 10x. Like the RCC, it utilizes a Common Infrastructure Block to guarantee the testing of external I/O connections and maximize application usefulness.

Insertion of New Technologies in RCC Products

Applying Chalcogenide to reconfigurable processing architecture can be done in several steps. Replacement of SUROM and configuration SRAM with C-RAM or other 4 Mbit non-volatile memory is the most straightforward and mostly a board design problem. It results in power, real estate and complexity savings as well as radiation tolerance enhancements.

Figure 7:
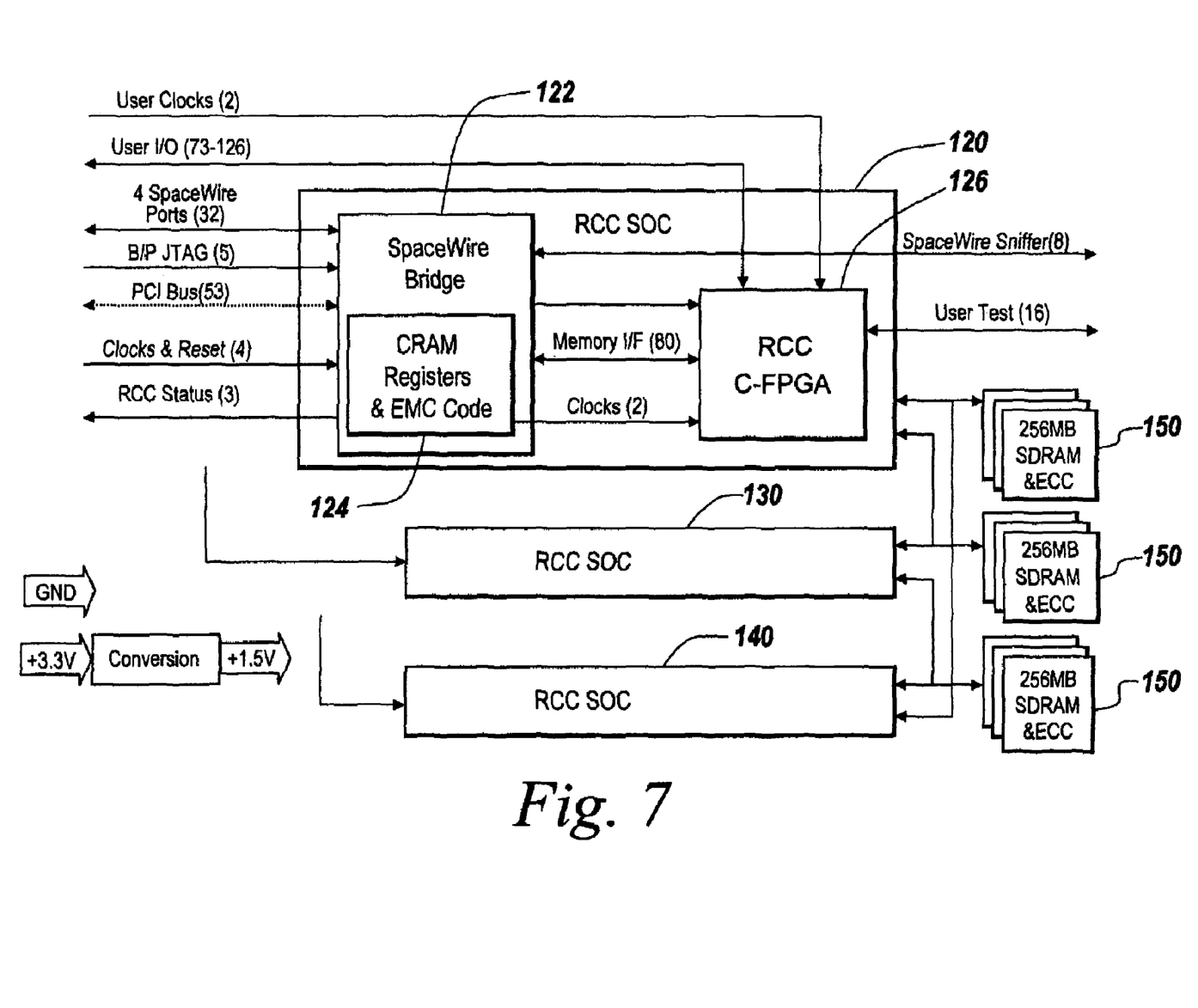
FIG. 7 shows a high level diagram of a 3U reconfigurable computer employing a system on a chip with C-RAM and C-FPGAs.

With C-FPGA or equivalent non-volatile FPGAs, the potential exists to collapse the 3U board of FIG. 6 into a single chip. FIG. 7 shows a high level diagram of such a 3U reconfigurable computer. Here an RCC system on a chop or SOC 120 includes a SpaceWire Bridge 122 having embedded therein CRAM Register and embedded microcontroller (EMC) code 124. On-board RCC C-FPGA memory 126 is shared with SpaceWire Bridge 122, with Bridge 122 supplying clocks for the C-FPGA.

The RCC SOCs are replicated as shown at 130 and 140, with a series of 256 MB SDRAM and ECCs 150 coupled to the RCC SOCs as indicated. Note that various inputs and outputs to the SOC are as listed.

As in the commercial arena where PCI and high-speed interfaces are programmable into high performance FPGAs, this could easily have a large amount of programmable logic with both PCI for control and data handling and SpaceWire or FireWire or better for high-speed interfaces. The resulting systems shrink the cluster in FIG. 5 down to a card interconnected by these interfaces both internally and externally, with the increase in processing and reconfigurability being quite significant.

Figure 8:
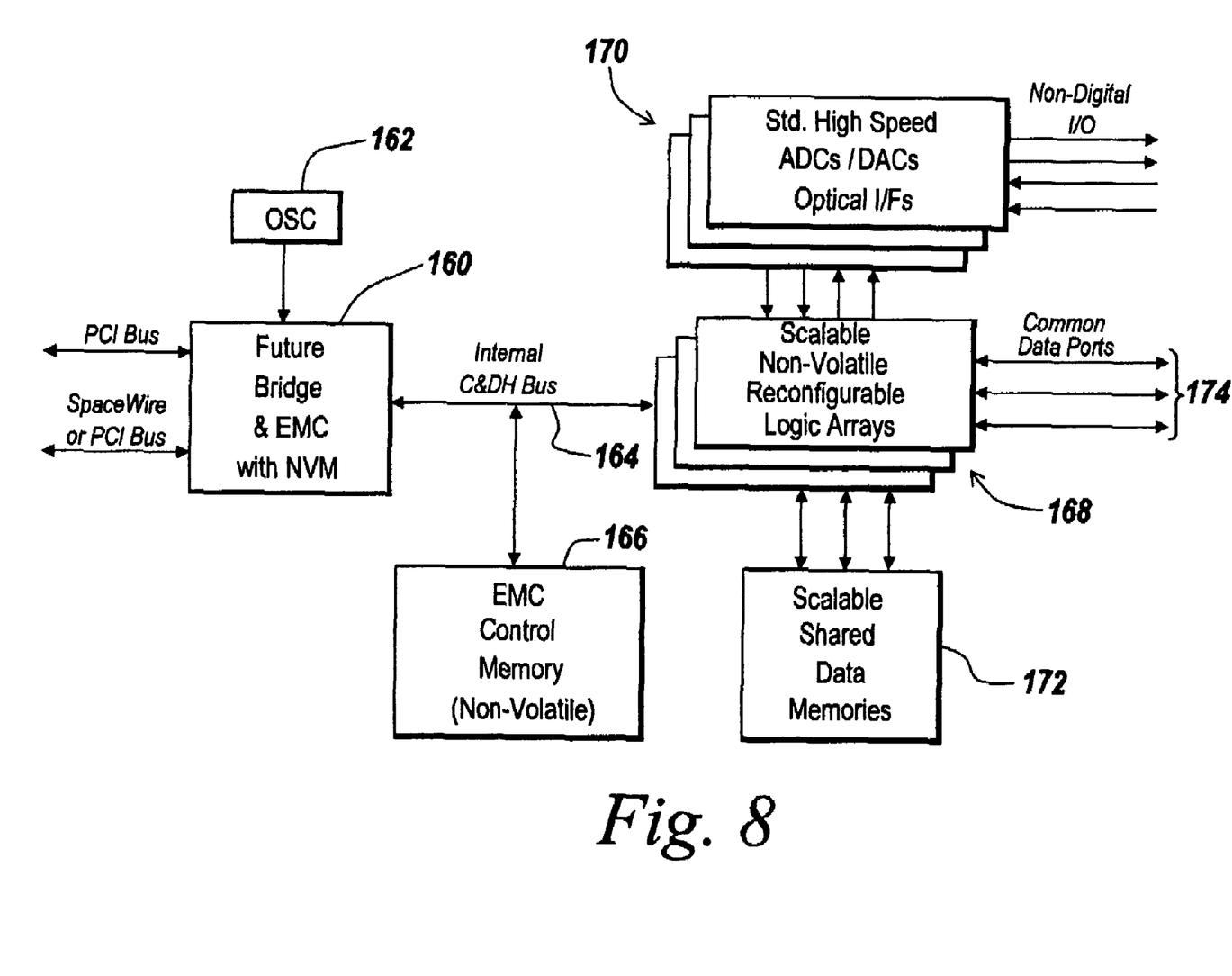
FIG. 8 is a block diagram of a generalized reconfigurable computer using C-RAM and C-FPGAs.

FIG. 8 shows a generalized block diagram of a future reconfigurable computer utilizing C-RAM and C-FPGA. Here the bridge 160 having an oscillator 162 coupled thereto has a number of bus modes for a PCI bus or SpaceWire bus. An internal bus 164 couples bridge 160 to an EMC control memory 166 and to a number of large C-FPGAs 168. These C-FPGAs are interconnected to direct interfaces 170, which can include standard high-speed analog-to-digital or digital-to-analog converters or to optical I/F stages. Scaleable shared data memories 172 are coupled to respective C-FPGAs 168.

Bridge 160 can take the form of the collapsed single chip bridge described above and would utilize both C-RAM for configuration memory and C-FPGAs for reconfiguring its interconnects with the command and data handling part of the system. Additional EMC Control Memory 166 consisting of C-RAM is used if large amounts of processing are required. The large C-FPGAs 168 are shown in a bank and would be one to several million gates of logic each with configurable interfaces and interconnects between them and external to them through Common Data Ports 174. Shared volatile and non-volatile data memories 172 are used by Logic Arrays 168 for data processing and data storage. Direct interfaces 170 with non-digital elements are realized by Analog to Digital Converters, Digital to Analog Converters, Optical Transceivers and other Sensor to Digital conversion elements. C-RAM and C-FPGA elements may be utilized for configuration, storage and any logic behavior changes.

Having now described a few embodiments of the invention, and some modifications and variations thereto, it should be apparent to those skilled in the art that the foregoing is merely illustrative and not limiting, having been presented by the way of example only. Numerous modifications and other embodiments are within the scope of one of ordinary skill in the art and are contemplated as falling within the scope of the invention as limited only by the appended claims and equivalents thereto.

What is claimed is:

1. A method for improving the non-volatility and radiation hardening of a spaceborne system involving reconfigurable components comprising the step of providing at least one of the reconfigurable components with reconfigurable chalcogenide-based switching components.

2. The method of claim 1 wherein the switching components are provided as part of a random access memory, thus to provide for radiation hardening thereof.

3. The method of claim 1, wherein the spaceborne system includes multi-processors and multi-processor architecture.

4. The method of claim 1, wherein the spaceborne system includes hardware building blocks utilizing the chalcogenide technology, the hardware building blocks taken from the group consisting of arrays of data latches, reprogrammable analog devices, multi-state memory, and field programmable gate arrays.

5. The method of claim 1, wherein one of the hardware building blocks includes a read-only memory.

6. The method of claim 1, wherein one of the bardware building blocks is embedded within a chip as a core and includes a field programmable gate array.

7. The method of claim 1, wherein one of the hardware building blocks includes a random access memory.

8. The method of claim 1, wherein one of the hardware building blocks includes a shadow state storage having a reversible chalcogenide fuse, wire or configuration bit.

9. The method of claim 1, wherein the spaceborne system includes software building blocks utilizing the chalcogenide technology and not including hardware building blocks involving programming circuits.

10. The method of claim 9, wherein at least one of the software building blocks includes a chalcogenide-based memory.

11. The method of claim 1, wherein the spaceborne system includes a reversible chalcogenide fuse, wire or configuration bit.

12. The method of claim 11, wherein the spaceborne system includes a switching element and wherein the fuse, wire or configuration bit is in series with the switching element.

13. A method for improving the non-volatility and radiation hardening a spaceborne system, comprising the step of providing the spaceborne system with reconfigurable elements employing chalcogenide-based switching elements.

14. A method for improving the non-volatility and radiation hardening a spaceborne system, comprising the step of providing the spaceborne system with a C-RAM-based ROM.

15. A method for improving the non-volatility and radiation hardening a spaceborne system, comprising the step of providing the system with a C-RAM-based FPGA element embedded within a chip as a core.

16. A method for improving the non-volatility and radiation hardening a spaceborne system, comprising the step of implementing the spaceborne system in a single chip that includes internal C-RAM devices having at least one switching component employing a reversible chalcogenide fuse, wire or configuration chip.

17. The method of claim 16, wherein the single chip includes at least one C-RAM.

* * * * *

UNITED STATES PATENT AND TRADEMARK OFFICE
CERTIFICATE OF CORRECTION

| | | |
|---|---|---|
| PATENT NO. | : 7,337,160 B2 | Page 1 of 1 |
| APPLICATION NO. | : 10/918814 | |
| DATED | : February 26, 2008 | |
| INVENTOR(S) | : Marshall et al. | |

It is certified that error appears in the above-identified patent and that said Letters Patent is hereby corrected as shown below:

Title page, item (63), in Column 1, Line 1, delete "Continuation of application" and insert -- Continuation-in-part of application --.

Column 1, line 10, delete "35 Usc" and insert -- 35 USC --.

Column 11, line 22, in Claim 1, delete "components comprising" and insert -- components, comprising --.

Column 11, line 25, in Claim 2, delete "claim 1 wherein" and insert -- claim 1, wherein --.

Column 11, line 38, in Claim 6, delete "bardware" and insert -- hardware --.

Signed and Sealed this
Tenth Day of April, 2012

David J. Kappos
*Director of the United States Patent and Trademark Office*